(12) United States Patent
Park

(10) Patent No.: US 8,134,213 B2
(45) Date of Patent: Mar. 13, 2012

(54) STATIC RANDOM ACCESS MEMORY AND METHOD FOR MANUFACTURING THE SAME

(75) Inventor: Sung Hee Park, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 1475 days.

(21) Appl. No.: 11/648,381

(22) Filed: Dec. 28, 2006

(65) Prior Publication Data

US 2007/0158758 A1    Jul. 12, 2007

(30) Foreign Application Priority Data

Dec. 29, 2005   (KR) .................. 10-2005-0134466

(51) Int. Cl.
*H01L 27/088* (2006.01)

(52) U.S. Cl. .................. 257/393; 257/903; 257/E27.098

(58) Field of Classification Search .................. 257/393, 257/903, E27.098, 379
See application file for complete search history.

(56) References Cited

U.S. PATENT DOCUMENTS

| | | | |
|---|---|---|---|
| 5,072,286 A * | 12/1991 | Minami et al. .................. 257/208 |
| 5,124,774 A | 6/1992 | Godinho et al. |
| 5,170,944 A | 12/1992 | Shirai |
| 5,296,729 A | 3/1994 | Yamanaka et al. |
| 5,353,245 A | 10/1994 | Lee et al. |
| 5,379,247 A | 1/1995 | Kuriyama et al. |
| 5,422,296 A | 6/1995 | Lage |
| 5,736,438 A | 4/1998 | Nishimura et al. |
| 5,981,995 A | 11/1999 | Selcuk |
| 6,812,574 B2 | 11/2004 | Tomita et al. |
| 7,098,478 B2 * | 8/2006 | Takaura et al. .................. 257/67 |

FOREIGN PATENT DOCUMENTS

| | | |
|---|---|---|
| EP | 0 550 177 A1 | 7/1993 |
| JP | 2-172273 A | 7/1990 |

OTHER PUBLICATIONS

English Translation of German Office Action for German Application No. 102006061028.8-33 (1st page only); Drafted Oct. 30, 2007.
Satoshi Meguro, Kiyobumi Uchibori, Norio Suzuki, Makoto Motoyoshi, Atsuyoshi Koike, Toshiaki Yamanaka, Yoshio Sakai, Shigeru Honjo, Osamu Minato, Toru Kaga, Naotaka Hashimoto, and Koji Hashimoto; "Semiconductor Integrated Circuit Device"; esp@cenet; Abstract of Publication No. JP2172273 (A); Publication Date: Jul. 3, 1990; esp@cenet Database—Worldwide.

* cited by examiner

*Primary Examiner* — Chuong A Luu
*Assistant Examiner* — Nga Doan
(74) *Attorney, Agent, or Firm* — The Law Offices of Andrew D. Fortney; Andrew D. Fortney; Ryan S. Dunning

(57) ABSTRACT

Disclosed is a static random access memory (SRAM), which includes first and second access transistors composed of metal oxide semiconductor (MOS) transistors, first and second drive transistors composed of MOS transistors, and first and second p-channel thin film transistors (TFTs) used as pull-up devices. The SRAM includes a ground potential layer disposed as a common source of the first and second drive transistors, and formed by implanting a dopant into a semiconductor substrate, a power supply potential layer connected with sources of the first and second p-channel TFTs, and an insulating layer formed on the substrate and interposed between the ground potential layer and the power supply potential layer.

18 Claims, 5 Drawing Sheets

STATIC RANDOM ACCESS MEMORY AND METHOD FOR MANUFACTURING THE SAME

BACKGROUND OF THE INVENTION

1. Field of the Invention

The present invention relates to a static random access memory (SRAM) and a method for manufacturing the same.

2. Description of the Related Art

A static random access memory (SRAM) is designed such that it can always store data on the basis of a circuit employing a latch mode. The SRAM has high-speed operation and low power consumption, and does not need to periodically refresh stored information unlike a dynamic random access memory (DRAM).

In general, the SRAM is composed of two pull-down devices, two access devices, and two pull-up devices, and is divided into three types, a complete complimentary metal oxide semiconductor (CMOS) type, a high load resistor (HLR) type, and a thin film transistor (TFT) type, according to the configuration of the pull-up devices. The full CMOS type SRAM uses p-channel bulk metal oxide semiconductor field effect transistors (MOSFETs) as the pull-down devices. The HLR type SRAM uses polysilicon layers having high resistance as the pull-up devices. The TFT type SRAM uses p-channel polysilicon TFTs as the pull-up devices. Here, the TFT type SRAM can remarkably reduce a cell size, and thus is easily applied to a semiconductor memory used for a memory device only.

The SRAM has various structures, the most popular one of which is the full CMOS type SRAM composed of six transistors. Further, the full CMOS type SRAM employs a p-channel TFT in order to increase integration density of the memory cell due to its wide area. However, due to high resistance of the power supply potential Vcc, the full CMOS type SRAM has a slow operating speed.

SUMMARY OF THE INVENTION

Accordingly, the present invention is directed to a static random access memory (SRAM) structure in which driving capability is further improved.

An object of the present invention is to provide a method for manufacturing an SRAM, in which a power supply potential layer is disposed adjacent to a ground potential layer in order to increase an operating speed of the SRAM, and a latch-up phenomenon that can occur between the power supply potential layer and the ground potential layer can be effectively prevented.

According to an aspect of the present invention, a static random access memory (SRAM), which includes first and second access transistors composed of metal oxide semiconductor (MOS) transistors, first and second drive transistors composed of MOS transistors, and first and second p-channel thin film transistors (TFTs) used as pull-up devices, includes a ground potential layer disposed as a common source of the first and second drive transistors, and formed by implanting a dopant into a semiconductor substrate, a power supply potential layer connected with sources of the first and second p-channel TFTs, and an insulating layer formed on the substrate and interposed between the ground potential layer and the power supply potential layer.

According to another aspect of the present invention, a method of manufacturing an SRAM, in which the SRAM includes first and second access transistors composed of MOS transistors, first and second drive transistors composed of MOS transistors, and first and second p-channel TFTs used as pull-up devices, includes the steps of forming a photoresist pattern exposing an active region of a semiconductor substrate at a predetermined width, implanting a dopant into part of the active region exposed by the photoresist pattern to thereby form a ground potential layer, removing the photoresist pattern, forming an insulating layer on the ground potential layer, and forming an power supply potential layer on the insulating layer.

DETAILED DESCRIPTION OF THE PREFERRED EMBODIMENTS

Hereinafter, a static random access memory (SRAM) and a method for manufacturing the same in accordance with an embodiment of the present invention will be described with reference to the accompanying drawings.

In the following description of an embodiment of the present invention, when a layer is formed "on" another layer, it may be formed directly on the other layer, or one or more intervening layers may be present.

Figure 1:
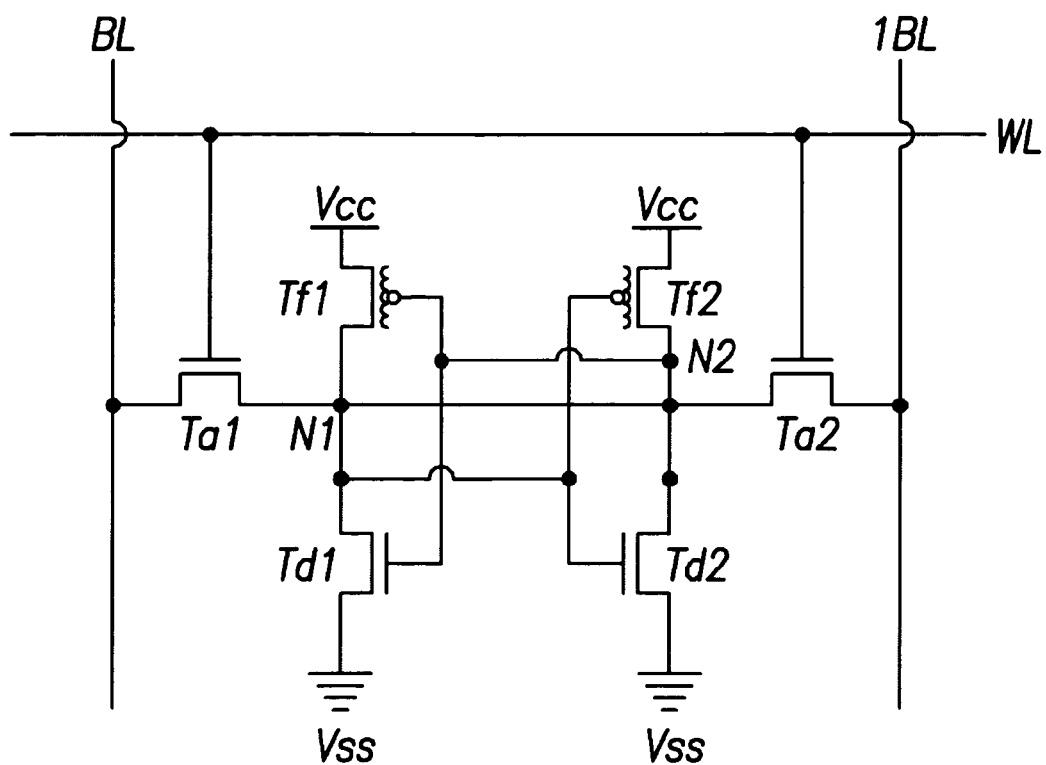
FIG. 1 is a circuit diagram illustrating a static random access memory (SRAM) according to an embodiment of the present invention.

FIG. 1 is a circuit diagram illustrating a static random access memory (SRAM) according to an embodiment of the present invention. Here, a PMOS transistor is used as a resistor device by way of example. Further, FIG. 2A is a layout view illustrating an SRAM according to an embodiment of the present invention, and FIG. 2B is a sectional view taken along line A-A of FIG. 2A.

Referring to FIG. 1, a SRAM cell includes first and second access NMOS transistors (TFTs) Ta1 and Ta2 that connect a bit line BL and a bit line bar /BL with a first node N1 and a second node N2 of the memory cell, first and second p-channel TFTs Tf1 and Tf2 that are connected between a power supply potential layer Vcc and the nodes N1 and N2, and first and second drive NMOS transistors Td1 and Td2 that are connected between the nodes N1 and N2 and a ground potential layer Vss.

Here, the first p-channel TFT Tf1 and the first drive NMOS transistor Td1 are controlled by a signal of the second node N2, thereby supplying the voltage of the power supply potential layer Vcc or the ground potential layer Vss to the first node N1. Similarly, the second p-channel TFT Tf2 and the second drive NMOS transistor Td2 are controlled by a signal of the first node N1, thereby supplying the voltage of the power supply potential layer Vcc or the ground potential layer Vss to the second node N2. A point at which the first access NMOS transistor Ta1 as an access device, the first drive NMOS transistor Td1 as a pull-down device, and the first p-channel TFT Tf1 as a pull-up device intersect is the first node N1 storing data, while another point at which the second access NMOS transistor Ta2, the second drive NMOS transistor Td2, and the second p-channel TFT Tf2 intersect is the second node N2 storing data.

Figure 2A:
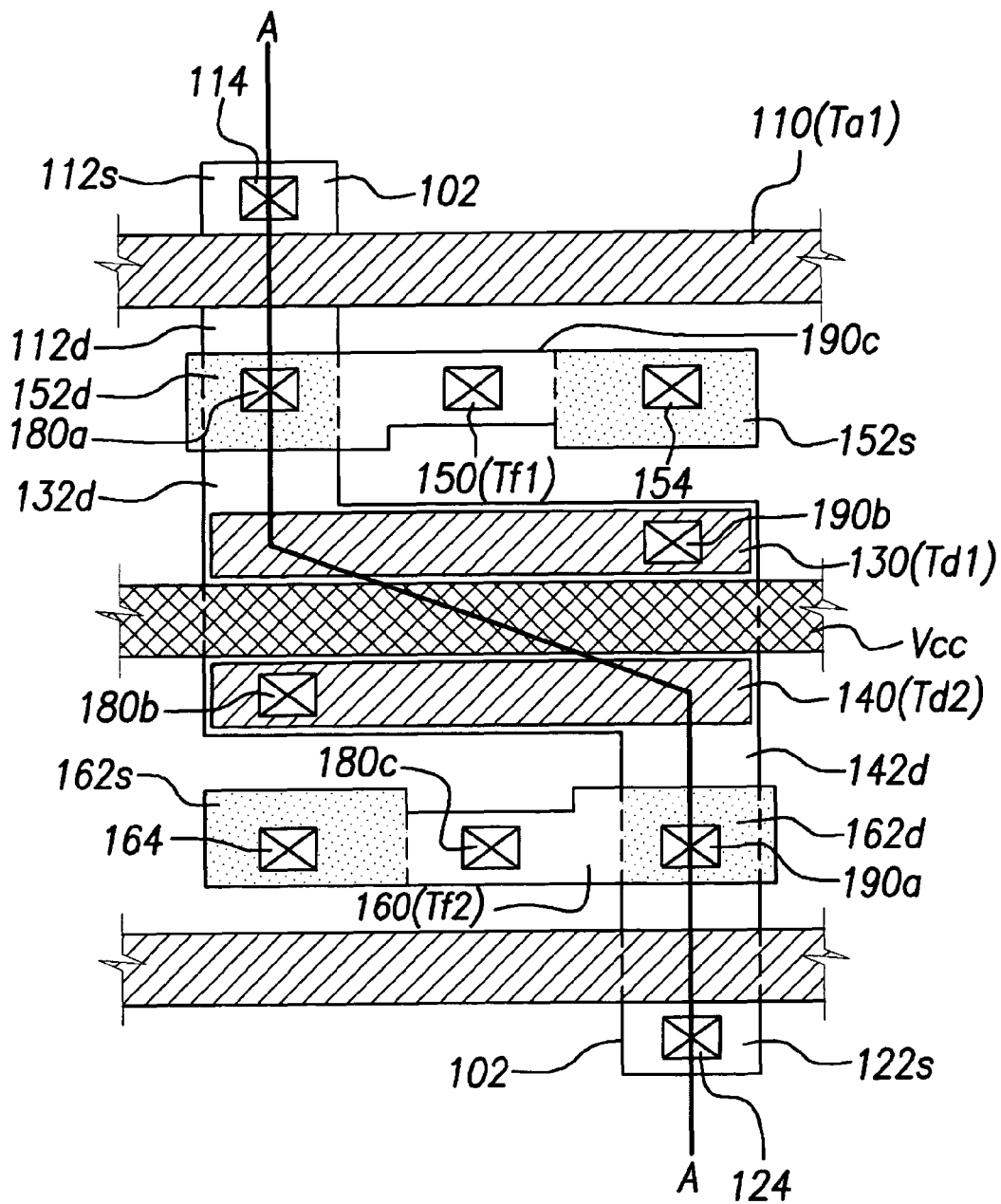
FIG. 2A is a layout view illustrating an SRAM according to an embodiment of the present invention.
Figure 2B:
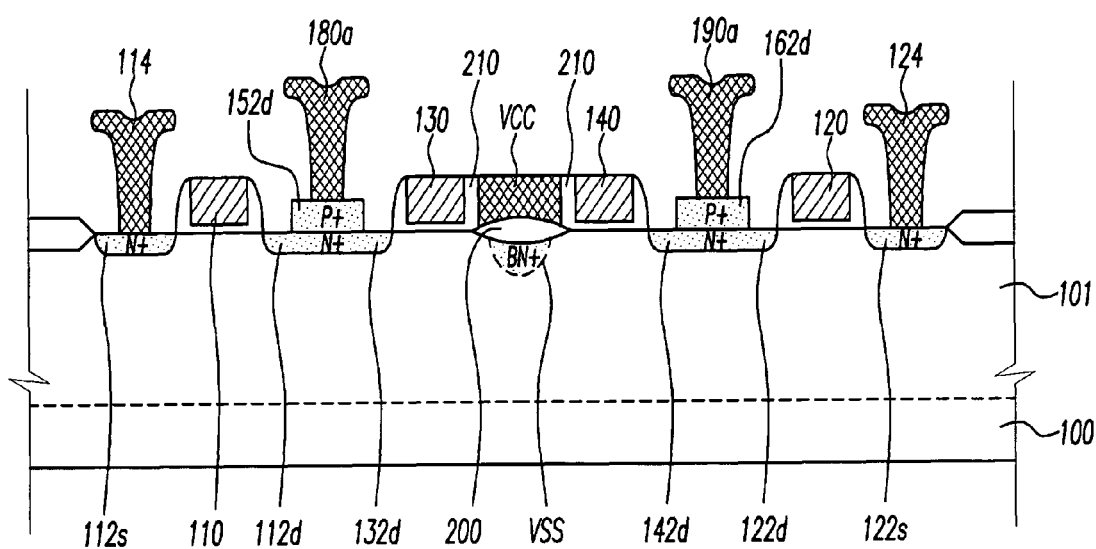
FIG. 2B is a sectional view taken along line A-A of FIG. 2A.

Referring to FIGS. 2A and 2B, an n-type semiconductor substrate 100 has a well 101 into which the opposite conductive type dopant (i.e. a p-type dopant) is implanted, and an active region 102 that is defined by an isolation layer. A gate 110 of the first access NMOS transistor Ta1 and a gate 120 of the second access NMOS transistor Ta2 are connected to a word line WL. A source 112s of the first access NMOS transistor Ta1 and a source 122s of the second access NMOS transistor Ta2, which are formed by the implantation of a n-type dopant, are connected to the bit line BL and the bit line bar /BL through contacts 114 and 124, respectively.

Meanwhile, a drain 112d of the first access NMOS transistor Ta1 and a drain 132d of the first drive NMOS transistor Td1, which are formed by the implantation of the n-type dopant, are connected with a drain 152d of the first p-channel TFT Tf1, which is formed by the implantation of the p-type dopant, and with a gate 140 of the second drive NMOS transistor Td2 and a gate 160 of the second p-channel TFT Tf2 through contacts 180a, 180b and 180c. Similarly, a drain 122d of the second access NMOS transistor Ta2 and a drain 142d of the second drive NMOS transistor Td2, which are formed by the implantation of the n-type dopant, are connected with a drain 162d of the second p-channel TFT Tf2, which is formed by the implantation of the p-type dopant, and with a gate 130 of the first drive NMOS transistor Td1 and a gate 150 of the first p-channel TFT Tf1 through contacts 190a, 190b and 190c.

Further, sources 152s and 162s of the first and second p-channel TFT Tf1 and Tf2 which are implanted with the p-type dopant are connected to the power supply potential layer Vcc via contacts 154 and 164, respectively. The power supply potential layer Vcc is located approximately in the middle of the active region 102, and the gates 130 and 140 of the first and second drive NMOS transistor Td1 and Td2 are arranged in parallel on opposite sides of the power supply potential layer Vcc. Further, insulating layers 210 are interposed between the power supply potential layer Vcc and the gates 130 and 140.

Referring to FIG. 2B, the ground potential layer Vss is formed below the power supply potential layer Vcc across another insulating layer 200. The ground potential layer Vss is formed as a buried layer BN+, which is implanted with the n-type dopant in the active region 102. Further, the ground potential layer Vss functions as a common source of the first and second drive NMOS transistor Td1 and Td2, which are formed on the opposite sides of the power supply potential layer Vcc.

In the SRAM as described above, the ground potential layer Vss is activated by a strong electric field formed at the power supply potential layer Vcc. Furthermore, when the ground potential layer Vss is activated, there occurs an effect that the first and second drive NMOS transistor Td1 and Td2 get a channel length shortened. Therefore, the operating speed of the SRAM can be increased.

Meanwhile, as illustrated in FIG. 2B, in order to prevent a latch-up phenomenon occurring when the power supply potential layer Vcc and the ground potential layer Vss are shorted, the insulating layer 200 is formed between the power supply potential layer Vcc and the ground potential layer Vss. Especially, the opposite ends of the insulating layer 200 is formed in the shape of a bird's beak, thereby having a lenticular shape.

Hereinafter, a method of forming the power supply potential layer Vcc and the ground potential layer Vss having the above-described structure will be described with reference to FIGS. 3A, 3B and 3C.

Figure 3A:
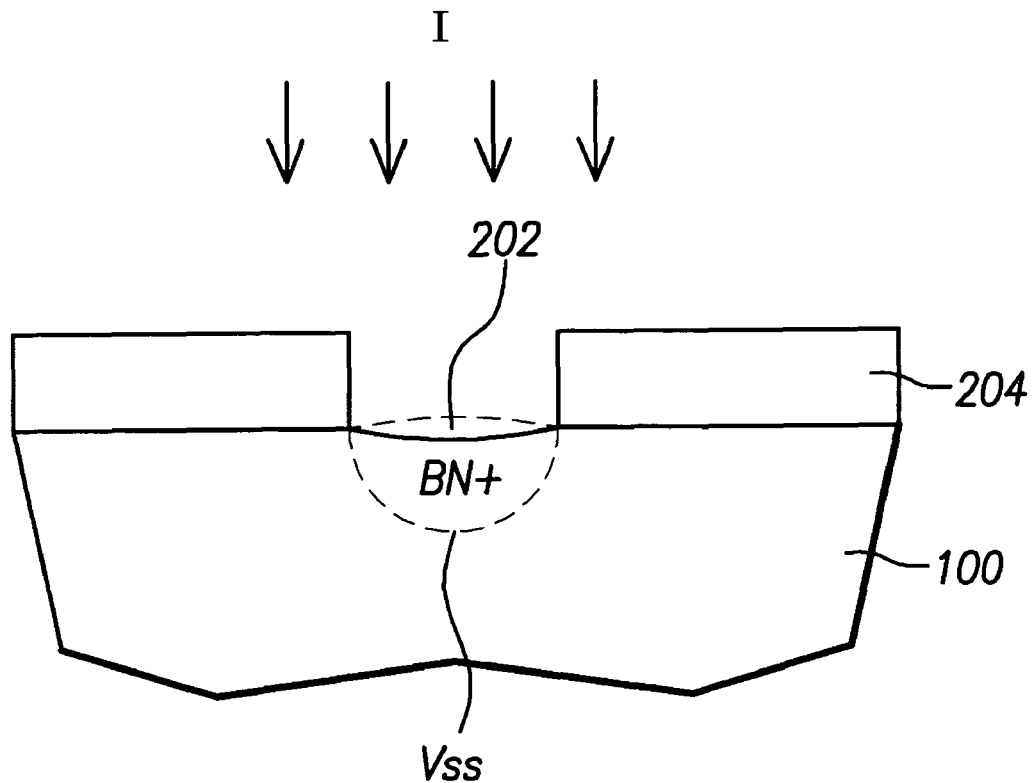
FIGS. 3A, 3B and 3C are sectional views for explaining a method of forming a power supply potential layer and a ground potential layer in parallel in an SRAM according to an embodiment of the present invention.

First, as illustrated in FIG. 3A, a photoresist pattern 204 having an opening running through approximately the middle of the active region is formed on the substrate 100. An n-type dopant I is implanted into the exposed substrate using the photoresist pattern 204 as a mask, thereby forming a BN+ (buried N+) diffusion region that will be used as the ground potential layer Vss. At this time, since a top surface of the substrate is open, the ion implantation allows a recess 202 to be formed on the top surface of the exposed substrate.

Figure 3B:
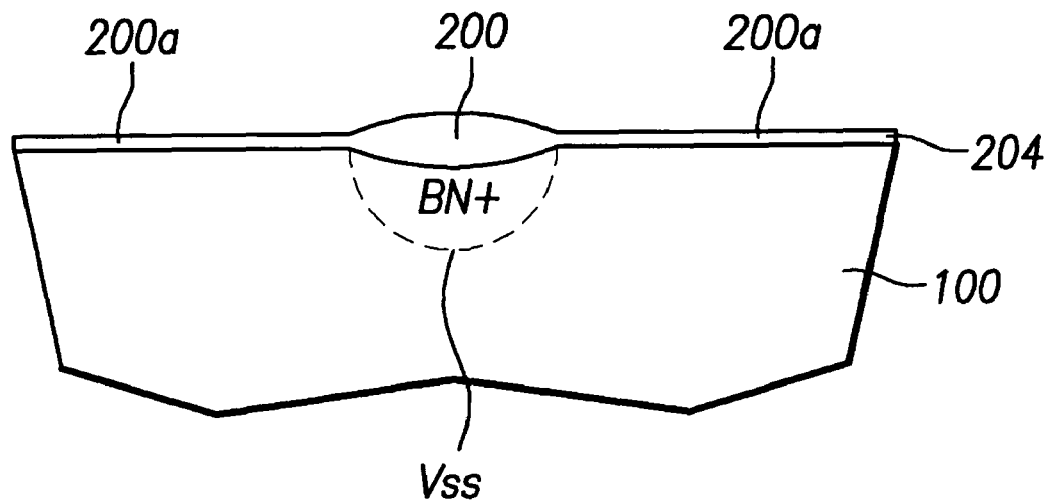
Figure 3C:
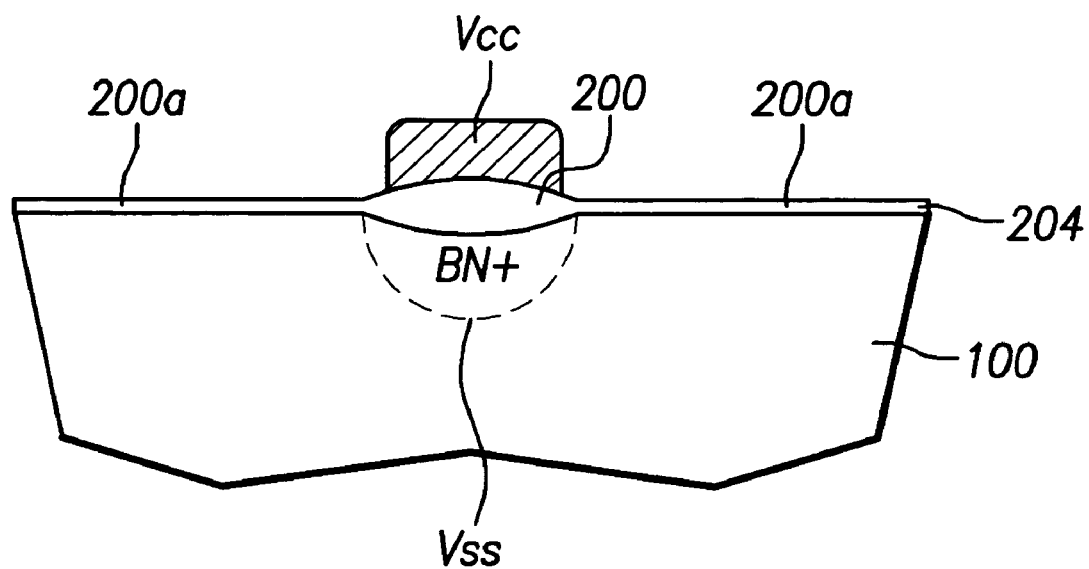

Next, as illustrated in FIG. 3B, the photoresist pattern 204 is removed completely, and then the top surface of the substrate. An oxide layer formed by the oxidation is swollen on the ground potential layer Vss due to the recess 202 and the implanted dopant. In other words, the opposite ends of the insulating layer 200 formed on the ground potential layer Vss is formed in the shape of a bird's beak, thereby having a lenticular shape.

Another oxide layer 200a may be formed on the rest of the active region which is not implanted with the dopant. As illustrated in FIG. 3C, the oxide layer 200a is completely removed for the subsequent process. A doped polysilicon layer or a conductive layer using tungsten is formed on the insulating layer 200, thereby forming the power supply potential layer Vcc. Thus, the power supply potential layer Vcc is separated from the ground potential layer Vss by means of the insulating layer 200, which can effectively prevent the latch-up phenomenon.

In the SRAM of the present invention, the power supply potential layer and the ground potential layer are disposed parallel to each other. Thus, the ground potential layer is activated by the strong electric field induced from the power supply potential layer. The activation of the ground potential layer increases the operating speed of the drive NMOS transistors. As a result, the operating speed of the SRAM can be greatly improved. Further, the latch-up phenomenon can be effectively prevented using the lenticular insulating layer formed between the power supply potential layer and the ground potential layer adjacent to each other.

Further, according to the present invention, the drive NMOS transistors are formed to have point symmetry with each other. This is equally applied to the access NMOS transistors. Thus, the symmetry of the SRAM cell can be maintained, so that the stability of the SRAM can be improved.

In addition, the gates 110 and 120 of the drive NMOS transistors Td1 and Td2 are vertically formed, thereby occupying the minimum area on the plan of the substrate. As a result, the integration density of the SRAM cell can be improved as well.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A static random access memory (SRAM), comprising:
   a substrate;
   first and second metal oxide semiconductor (MOS) access transistors on the substrate;
   first and second MOS drive transistors having a ground potential layer as a common source;
   first and second p-channel transistors configured as pull-up devices;
   a power supply potential layer connected to sources of the first and second p-channel transistors, wherein the first and second drive transistors have gates disposed opposite to each other on opposite sides of the power supply potential layer; and an insulating layer on the substrate, between the ground potential layer and the power supply potential layer, wherein the insulating layer has a lenticular shape, and opposite ends of the insulating layer each have a bird's beak.

2. The SRAM as claimed in claim 1, wherein the substrate is a semiconductor substrate, and the ground potential layer comprises a dopant implant region in the semiconductor substrate.

3. The SRAM as claimed in claim 1, wherein the ground potential layer and the power supply potential layer are parallel to each other.

4. The SRAM as claimed in claim 1, wherein the insulating layer comprises an oxide layer.

5. The SRAM as claimed in claim 4, wherein the oxide layer comprises a thermal oxide.

6. The SRAM as claimed in claim 1, wherein the first and second p-channel transistors comprise p-channel thin film transistors (TFTs).

7. The SRAM as claimed in claim 1, wherein the ground potential layer is directly below the power supply potential layer, across the insulating layer.

8. The SRAM as claimed in claim 1, wherein the power supply potential layer is located approximately in a middle portion of an active region of the substrate.

9. The SRAM as claimed in claim 1, wherein the first p-channel transistor is on a portion of the first access transistor and a portion of the first drive transistor, and a second p-channel transistor is on a portion of the second access transistor and a portion of the second drive transistor.

10. The SRAM as claimed in claim 9, further comprising first and second contacts on an uppermost surface of the first and second p-channel transistors, respectively.

11. The SRAM as claimed in claim 1, further comprising insulating layers between the power supply potential layer and each of the first and second drive transistor gates.

12. The SRAM as claimed in claim 1, wherein a drain of the first access transistor and a drain of the first drive transistor comprise a first n-type dopant implant region, and a drain of the second access transistor and a drain of the second drive transistor comprise a second n-type dopant implant region.

13. The SRAM as claimed in claim 12, wherein the first p-channel transistor comprises a first p-type region on or over the first n-type dopant implant region, and the second p-channel transistor comprises a second p-type region on or over the second n-type dopant implant region.

14. The SRAM as claimed in claim 12, wherein the ground potential layer has a greater depth than the first and second n-type dopant implant regions.

15. The SRAM as claimed in claim 1, wherein the insulating layer has an equal or greater width than the ground potential layer.

16. The SRAM as claimed in claim 1, wherein the first and second drive transistors gates are parallel to each other.

17. The SRAM as claimed in claim 16, wherein the first and second drive transistor gates are parallel to the ground potential layer.

18. The SRAM as claimed in claim 16, wherein the first and second access transistors have gates that are parallel to the first and second drive transistor gates.

* * * * *